(12) United States Patent
Xu et al.

(10) Patent No.: US 8,275,972 B2
(45) Date of Patent: Sep. 25, 2012

(54) WRITE DATA MASK METHOD AND SYSTEM

(75) Inventors: Xiaoling Xu, Santa Clara, CA (US); Warren F. Kruger, Sunnyvale, CA (US)

(73) Assignee: ATI Technologies, Inc., Markham, Ontario (CA)

( * ) Notice: Subject to any disclaimer, the term of this patent is extended or adjusted under 35 U.S.C. 154(b) by 90 days.

(21) Appl. No.: 11/509,143

(22) Filed: Aug. 23, 2006

(65) Prior Publication Data

US 2008/0052474 A1 Feb. 28, 2008

(51) Int. Cl.
*G06F 12/04* (2006.01)
(52) U.S. Cl. .................... 711/211; 711/E12.015
(58) Field of Classification Search .......... 711/211, 711/220, 154, E12.015
See application file for complete search history.

(56) References Cited

U.S. PATENT DOCUMENTS

| | | | |
|---|---|---|---|
| 5,224,214 A | 6/1993 | Rosich | |
| 5,703,810 A | 12/1997 | Nagy | |
| 6,141,741 A * | 10/2000 | Priem et al. | 711/217 |
| 6,371,854 B1 * | 4/2002 | Ikeda et al. | 463/42 |
| 6,535,965 B1 | 3/2003 | Ikeda et al. | |
| 6,714,460 B2 | 3/2004 | LaBerge | |
| 6,877,076 B1 * | 4/2005 | Cho et al. | 711/157 |
| 7,196,710 B1 * | 3/2007 | Fouladi et al. | 345/553 |
| 7,606,932 B1 * | 10/2009 | Cypher | 709/236 |
| 2003/0061460 A1 * | 3/2003 | Barth et al. | 711/167 |
| 2003/0126382 A1 * | 7/2003 | Dortu et al. | 711/154 |
| 2003/0182519 A1 * | 9/2003 | Riesenman et al. | 711/154 |
| 2004/0044508 A1 * | 3/2004 | Hoffman, Jr. | 703/13 |
| 2004/0139288 A1 * | 7/2004 | Perego et al. | 711/154 |
| 2005/0172049 A1 * | 8/2005 | Kamei et al. | 710/22 |
| 2005/0198468 A1 * | 9/2005 | Rubin et al. | 712/22 |
| 2006/0265546 A1 * | 11/2006 | Ganfield et al. | 711/105 |
| 2007/0129926 A1 * | 6/2007 | Verheyen et al. | 703/15 |

OTHER PUBLICATIONS

Form PCT/ISA/220, "PCT Notification of Transmittal of The International Search Report and the Written Opinion of the International Searching Authority, or the Declaration," 2 pgs.
Form PCT/ISA/210, "PCT International Search Report," 3 pgs.
Form PCT/ISA/237, "PCT Written Opinion of the International Searching Authority," 6 pgs.

\* cited by examiner

*Primary Examiner* — Hal Schnee
(74) *Attorney, Agent, or Firm* — Volpe and Koenig, P.C.

(57) ABSTRACT

In various embodiments, dedicated mask pins are eliminated by sending a data mask on address lines of the interface. A memory controller receives a request for a memory write operation from a memory client and determines the granularity of the write data from a write data mask sent by the client. Granularity, as used herein, indicates a quantity of write data to which each bit of the received write data mask applies. In an embodiment, the memory controller generates a particular write command and a particular write data mask based on the granularity of the write data. The write command generated is typically the most efficient of several write commands available, but embodiments are not so limited. The write command is transmitted on command lines of the interface, and the write data mask is transmitted on address lines of the interface.

20 Claims, 8 Drawing Sheets

FIG. 8

WRITE DATA MASK METHOD AND SYSTEM

TECHNICAL FIELD

The invention is in the field of data transfer in computer and other digital systems.

BACKGROUND

As computer and other digital systems become more complex and more capable, methods and hardware to enhance the transfer of data between system components or elements continually evolve. Data to be transferred includes digital signals representing data, commands, addresses, or any other information. System components or elements can include different functional hardware blocks on a single integrated circuit (IC), or on different ICs. The different ICs may or may not be on the same printed circuit board (PCB). System components typically include an input/output (I/O) interface specifically designed to receive data from other system components and to transmit data to other system components.

One consistent trend as computing systems become more capable is an increase in the amount of data to be transferred per time period. Some applications that require high data rates include game consoles, high definition television (HDTV), personal computers (PCs) main memory, graphics processors, and various consumer devices not already mentioned. In response to the demand for increased data rates, double data rate (DDR) standards have been developed to standardize the behavior of hardware and software using high data rates. Several generations of graphics DDR (GDDR) standards have been developed specifically for graphics processing and video processing, which typically demand the capability to transfer and process very large amounts of data.

In some instances, it is necessary to write only a portion of the bits in a transmission. For example, in a system that transmits 32 bytes, or 256 bits per command, some but not all of the 32 bytes might be written in a write operation. This will be referred to as a byte-write operation herein. One conventional byte-write method is to read the 256 bits that are in the DRAM, modify the portion to be changed, and write all of the 256 bits back. This method is commonly used in central processing units (CPUs), and is referred to as a read-modify-write operation. Unfortunately, for high-speed applications, such as graphics applications, read-modify-write operations are both too slow and too complex to implement. One reason is that graphics processors often use a complex operation reordering schemes in order to optimize the memory interface.

So historically DRAMs provide one additional data mask pin for every eight data pins, which indicates whether the eight bit data should be written or not. This data mask method is referred to in existing DRAM specifications. One disadvantage of this method is it results in one extra pin for every eight data bit pins, thus increasing the pin count.

In addition, the existing data mask method in existing DRAM specifications is not applicable in high speed interfaces which are susceptible to data bit errors. One reason is that the errors on the data mask pins are fatal. This is due to the fact that an error on the data mask pin may result in a byte write that was not intended. The data in that byte would be destroyed (overwritten) and could not be retried. In addition, an error on the data mask will make the error detection/correction feature provided by certain DRAMs useless.

FIG. 1A is a block diagram of components of a prior art digital system 100. The components include a processor 102 and a memory component 104. The processor 102 controls the memory component 104 by communicating over an interface that includes command lines, address lines, data lines, and separate, dedicated data mask lines. The memory component 100 is a DDR memory that communicates with the processor 102 over a DDR interface.

FIG. 1B is a timing diagram illustrating a write operation 106 with a data mask, as performed by the prior art components of FIG. 1A. In this illustration, a burst-of-8 write transaction has been issued. The top waveform is the clock (CLK) waveform. The waveform below the CLK waveform shows the command waveform (CMD) on the command lines. Three write commands are shown, write 108, write 110 and write 112. The data waveform is shown below the command waveform. In each of the valid data periods labeled 1-8, eight bits of data are transmitted. A data mask waveform is shown below the data waveform. The data mask waveform indicates the values being transmitted on the data mask lines. For write 108, the data mask line is high during the entire write. In this illustration, a low data mask bit, or a 0 logic level on a data mask line, indicates that the corresponding byte is to be written. So, for write 108, none of the bytes 108 are to be written.

Write 110 differs from write 108. Write 110 is a byte-write in which only particular bytes of the eight bytes are to be written. Referring to the data mask waveform for write 110, it can be seen that the data mask has a value of 10110111. Therefore, data mask pins and lines are required to be available for each write operation, even if byte-write operations make up a small percentage of write operations, as is often the case in many modern applications.

One approach to allowing byte-writes without the use of a dedicated mask pin is a reusable data mask. In DRAMs that support this capability, a memory controller can program the data mask into a register inside the DRAM and reuse it later. However, for many applications, including many graphics application, the number of reusable mask is small, so the performance improvement may not be very great.

BRIEF DESCRIPTION OF THE DRAWINGS

FIG. 8 is a diagram showing an alternative mapping of write data mask bits to data bytes according to an embodiment.

Figure 1A:
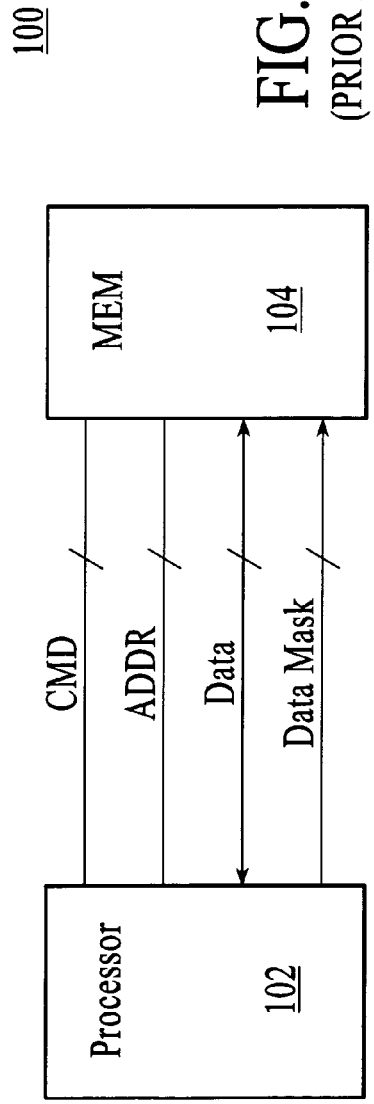
FIG. 1A is a block diagram of components of a prior art digital system.
Figure 1B:
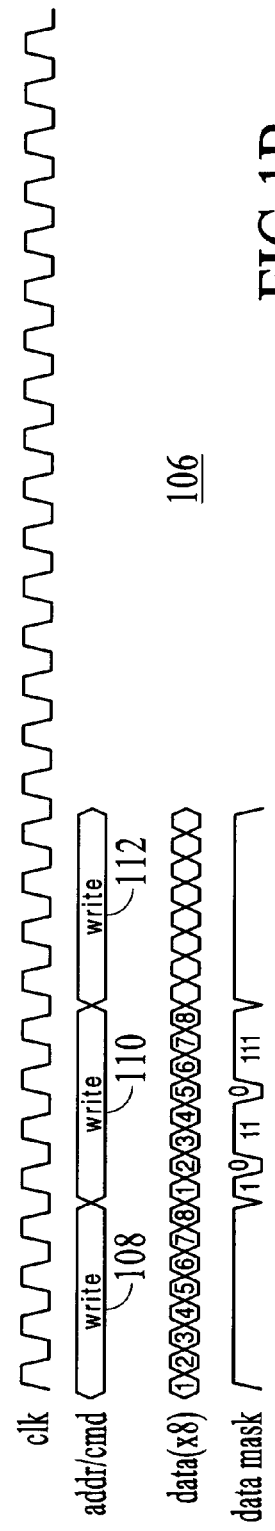
FIG. 1B is a timing diagram illustrating a write operation with a data mask, as performed by the prior art components of FIG. 1A.

In the drawings, the same reference numbers identify identical or substantially similar elements or acts. To easily identify the discussion of any particular element or act, the most significant digit or digits in a reference number refer to the Figure number in which that element is first introduced (e.g., element 102 is first introduced and discussed with respect to FIG. 1).

DETAILED DESCRIPTION

A method an apparatus for efficiently performing byte-write via a high-speed memory interface is described herein. As used herein a byte-write is a write of less than all of the data accommodated by a command cycle on the high-speed memory interface. In various embodiments, dedicated mask pins are eliminated by sending a data mask on address lines of the interface. A memory controller receives a request for a memory write operation from a memory client and determines the granularity of the write data from a write data mask sent by the client. Granularity, as used herein, indicates a quantity of write data to which each bit of the received write data mask applies. In an embodiment, the memory controller generates a particular write command and a particular write data mask based on the granularity of the write data. The write command generated is typically the most efficient of several write commands available, but embodiments are not so limited. The write command is transmitted on command lines of the interface, and the write data mask is transmitted on address lines of the interface. In the case of some write commands, circumstances, no additional cycles are required to perform a byte-write.

Figure 2:
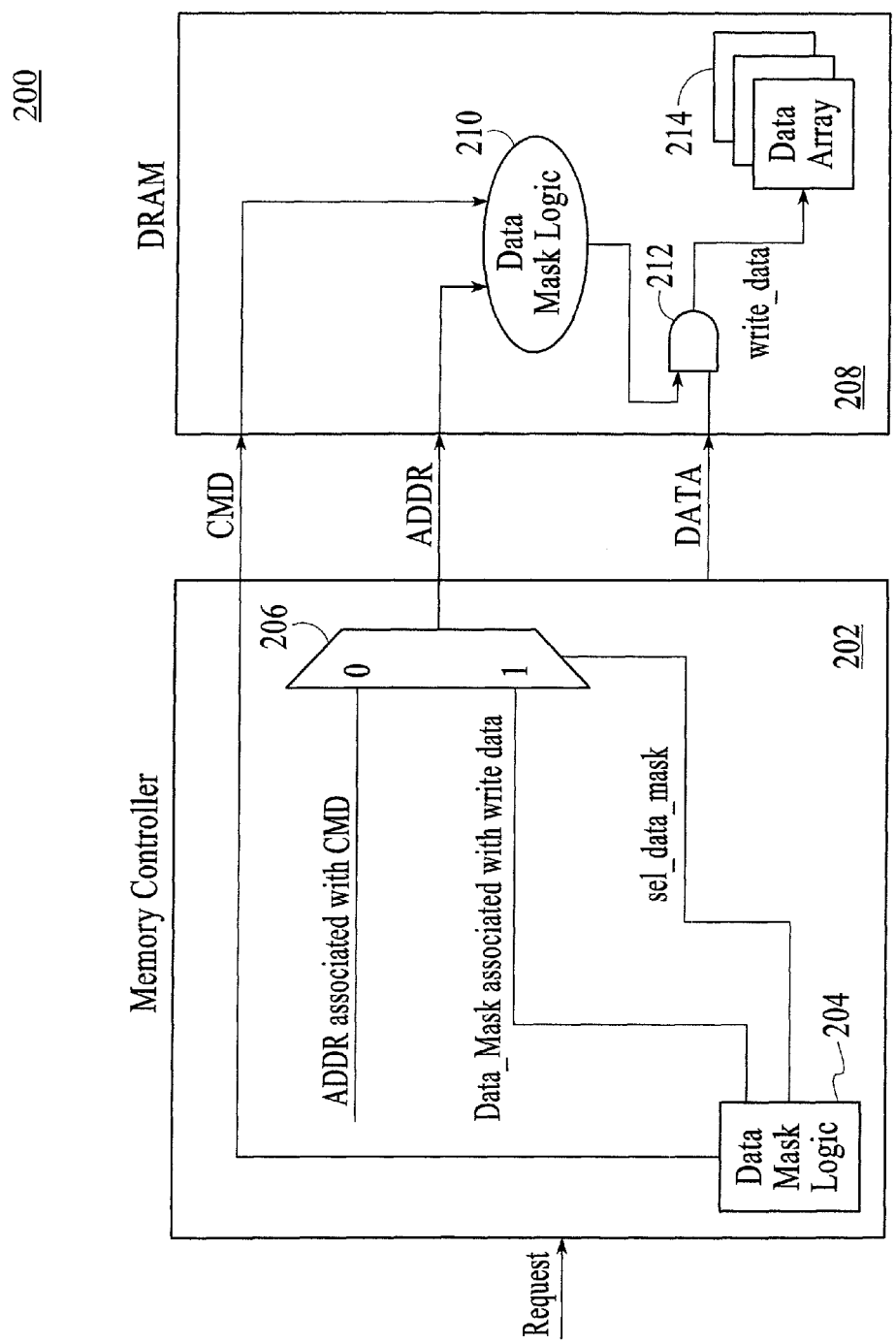
FIG. 2 is a block diagram of elements of a system, according to an embodiment.

FIG. 2 is a block diagram of elements of a system 200 according to an embodiment. The system 200 includes a memory controller 202 and a memory device 208. In an embodiment, the memory device 208 is a double data rate dynamic random access memory (DDRAM), but embodiments are not so limited. The memory controller 202 includes data mask logic 204 and selection logic 206. The memory controller 202 receives requests for memory access from various memory clients (not shown) in the system 200. As further described herein, the data mask logic examines write requests received and determines whether they include a write mask. If a received write request includes a write mask, the data mask logic determines which one of multiple data mask types should be used in performing the write operation. A write data mask type implies both a write data mask and a corresponding write command, as further described below. In an embodiment, the write data mask type is chosen based on which type would be most efficient, but in an alternative embodiment, the requester could specify a write data mask type.

When a write data mask type is determined, the data mask logic 204 generates the appropriate data mask associated with the write data and transmits it to the selection logic 206. The appropriate write command is generated as shown. In addition, the address associated with the write command is transmitted to the selection logic 206. The data mask logic 204 also generates a sel_data_mask signal that selects either the address or the data mask to be transmitted to the memory device 208 on the address lines of the interface.

The memory device 208 includes data mask logic 210 that receives the command on the command lines, the address and write data mask on the address lines. The data mask logic 210 determines from the command whether there is a write data mask, and also how to interpret the write data mask. Write data logic 212 receives the write data on data lines of the interface and also receives appropriately interpreted mask data from the data mask logic 210. The mask data includes individual bits that are interpreted to apply to one or more bytes of write data. In an embodiment, a bit of mask data that applies to one or more particular bytes of write data is a 0 if the one or more particular bytes are to be written to data array 214, and the bit of mask data is a 1 if the one or more particular bytes are not to be written to the data array 214. Other coding schemes are equally applicable.

Figure 3:
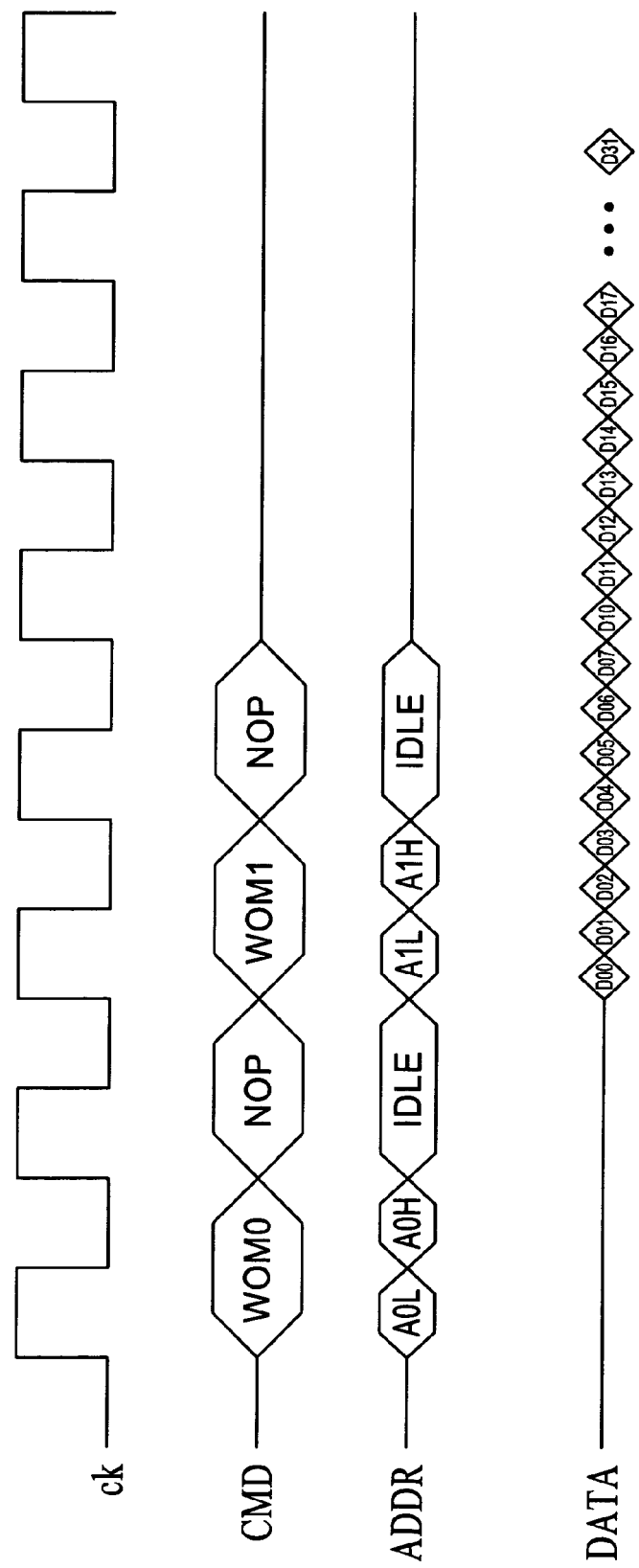
FIG. 3 is a timing diagram illustrating a write operation with a write_without_mask command, according to another embodiment.
Figure 4:
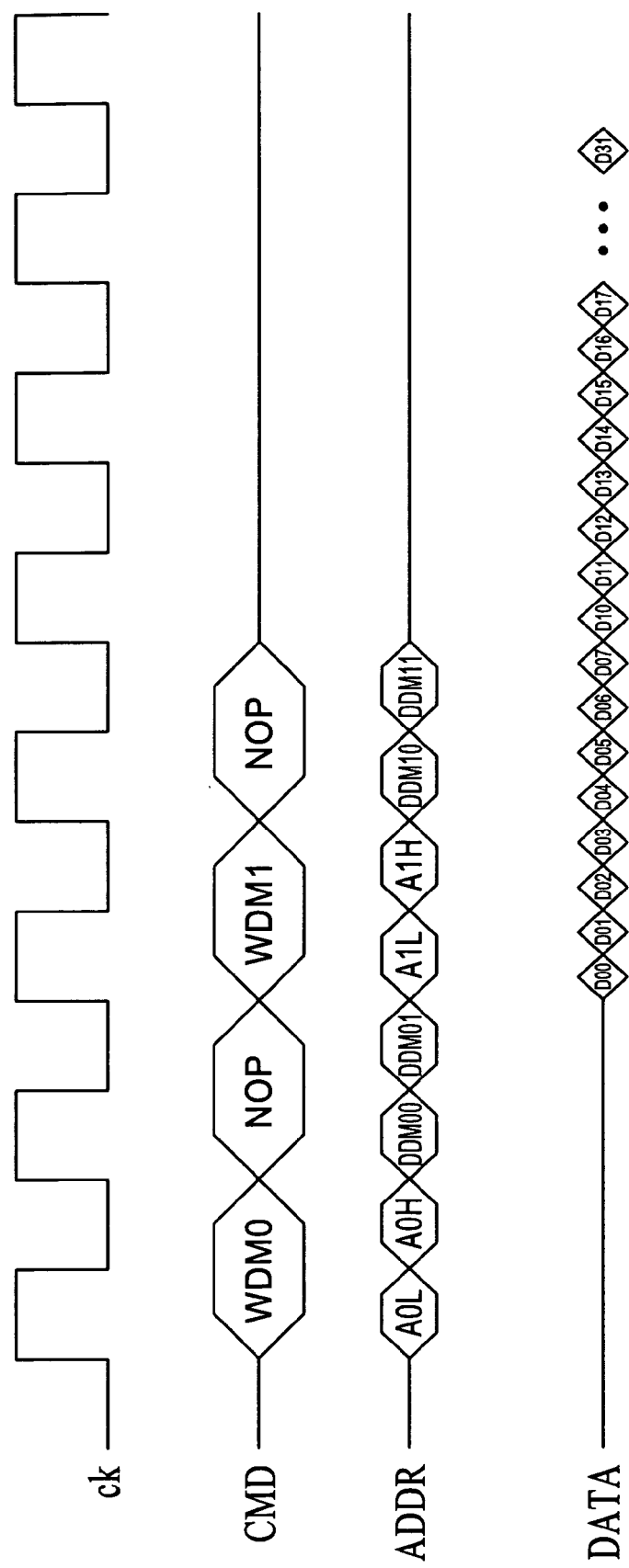
FIG. 4 is a timing diagram illustrating a write operation with a write_multiple_mask command, according to an embodiment.
Figure 5:
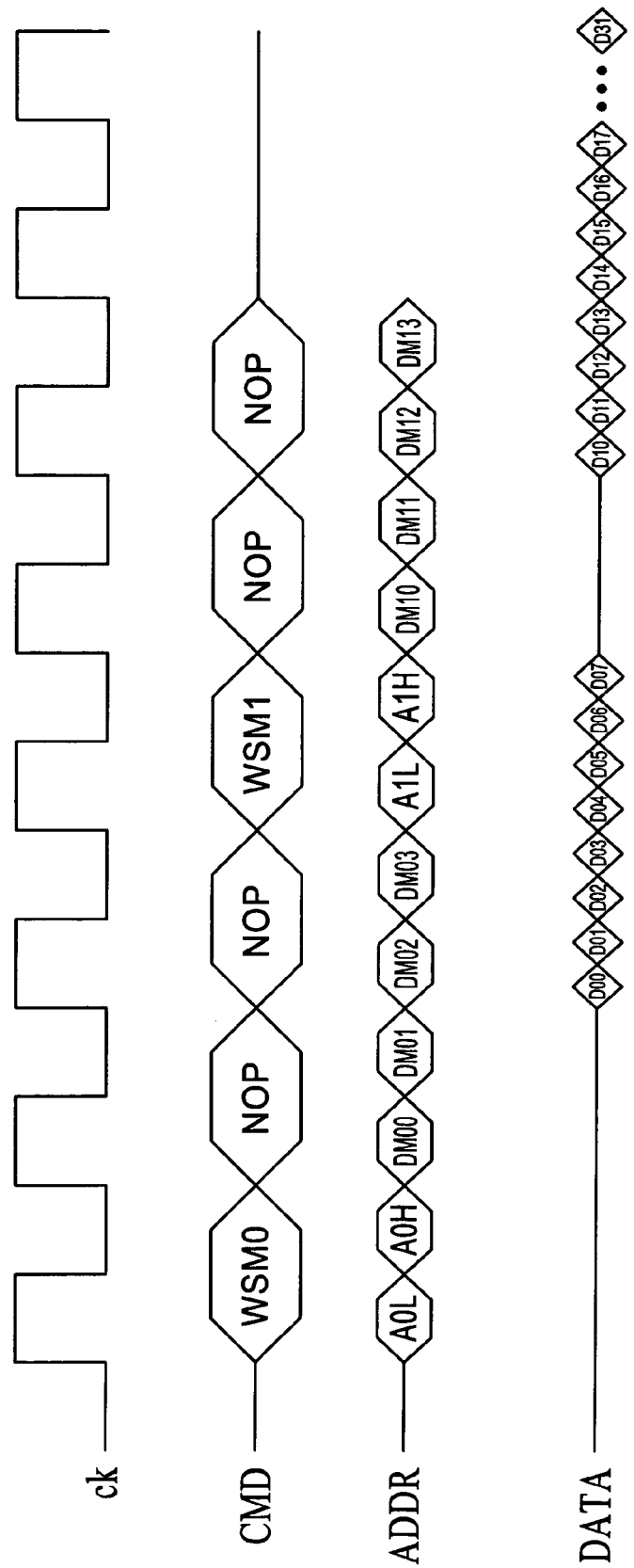
FIG. 5 is a timing diagram illustrating a write operation with a write_single_mask command, according to an embodiment.

FIGS. 3-5 are timing diagrams used to illustrate the write commands and write data masks according to data mask types of particular embodiments. FIGS. 3-5 are specific examples offered for the purpose of thoroughly describing the claimed invention, but they are not intended to be limited in any way. For example, in FIGS. 3-5 a high-speed memory interface that transfers 32 bytes of data per command is illustrated, but embodiments are applicable to other interface designs. An example protocol illustrated by FIGS. 3-5 is a graphics double-data-rate (GDDR) protocol such as GDDR5.

FIG. 3 is a timing diagram illustrating a write operation with a write_without_mask command, referenced as WOM. At the top of the diagram is a clock (clk) waveform showing the clock signal relevant to transmissions on the memory interface. A command line waveform (CMD) shows transmissions on the command lines. An address line waveform (ADDR) shows transmissions on the address lines. A data waveform (DATA) shows transmissions on the data lines.

One complete write operation will be described with reference to the first write_without_mask command, WOM0, although additional, similar write operations are shown in FIG. 3. The memory controller 202 has determined that there is no write data mask associated with a write request received from a memory client. Therefore, all bytes of data that are transmitted in the write operation are to be written to the memory device 208. The address associated with the WOM0 is 16 bits divided into 8 low address bits (A0L) and 8 high address bits (A0H). In an embodiment, a "no-operation" or NOP command follows WOM0. Here, we assume the specific application is doing a long burst of write, such that a NOP is inserted here to avoid data bus corruption. This NOP is not required by DRAM protocol, but will appear for many applications. Accordingly, the address lines are idle for the remainder of the available cycle time. In response to WOM0, 32 bytes of data D00-D31 are transmitted on the data lines of the interface and all are written to the memory device 208.

FIG. 4 is a timing diagram illustrating a write operation with a write_multiple_mask command, referenced as WDM in this example. The WDM command implies two bytes of data per write data mask bit as further described ("write double mask"), but in other embodiments the number could be three or more bytes of data per write data mask bit.

At the top of the diagram is a clock (clk) waveform showing the clock signal relevant to transmissions on the memory interface. A command line waveform (CMD) shows transmissions on the command lines. An address line waveform (ADDR) shows transmissions on the address lines. A data waveform (DATA) shows transmissions on the data lines.

One complete write operation will be described with reference to the first write_multiple_mask command, WDM0, although additional, similar write operations are shown in FIG. 4. The memory controller 202 has determined that there is a write data mask associated with a write request received from a memory client. The memory controller has further determined that the granularity of the write data is two bytes. That is, one bit of the write data mask applies to two bytes of write data. The address associated with the WDM0 is 16 bits divided into 8 low address bits (A0L) and 8 high address bits (A0H). In an embodiment, a "no-operation" or NOP command follows WDM0. This NOP is not required by DRAM protocol, but will appear for many applications. This available cycle time is used to transmit the write data mask as two 8-bit data mask portions, DDM00 and DDM01. Thus, in this case no additional time or pins are required to convey write data mask information to the memory device 208. In response to WDM0, 32 bytes of data D00-D31 are transmitted on the data lines of the interface and various bytes are written to the memory device 208 according to the write data mask. The write data mask includes 16 bits, each of which applies to a particular pair of bytes. That is, each write data mask bit is set or cleared to indicate whether or not to write a particular pair of bytes to the memory 208.

FIG. 5 is a timing diagram illustrating a write operation with a write_single_mask command, referenced as WSM in this example. The WSM command implies one bit of write data mask per write data byte.

At the top of the diagram is a clock (clk) waveform showing the clock signal relevant to transmissions on the memory interface. A command line waveform (CMD) shows transmissions on the command lines. An address line waveform (ADDR) shows transmissions on the address lines. A data waveform (DATA) shows transmissions on the data lines.

One complete write operation will be described with reference to the first write_single_mask command, WSM0, although additional, similar write operations are shown in FIG. 5. The memory controller 202 has determined that there is a write data mask associated with a write request received from a memory client. The memory controller has further determined that the granularity of the write data is one byte. That is, one bit of the write data mask applies to one byte of write data. The address associated with the WSM0 is 16 bits divided into 8 low address bits (A0L) and 8 high address bits (A0H). In an embodiment, a "no-operation" or NOP command follows WSM0. This NOP is not required by DRAM protocol, but will appear for many applications.

The write data mask associated with the WSM0 is 32 bits divided into four 8-bit portions, DM00, DM01, DM02, and DM03.

This available cycle time afforded by the NOP command is used to transmit DDM00 and DDM01. An additional NOP command is inserted to allow the transmission of DDM02 and DDM03. Thus, in this case there is a penalty for using such a fine granularity, but in various cases this is justified. In response to WSM0, 32 bytes of data D00-D31 are transmitted on the data lines of the interface and various bytes are written to the memory device 208 according to the write data mask. The write data mask includes 32 bits, each of which applies to a particular byte. That is, each write data mask bit is set or cleared to indicate whether or not to write a particular byte to the memory 208.

In various common applications, such as graphics applications, WDM and WOM will be used a great percentage of the time, due in part to the prevalence of 16-bit granularity data. In the case of a "mandatory" NOP cycle after a write command, the WDM command causes no performance degradation. Although the NOP cycle is not mandatory, in many applications such as graphic applications, the NOP is required to avoid data bus contention. So in most such applications any performance degradation is insignificant.

Figure 6:
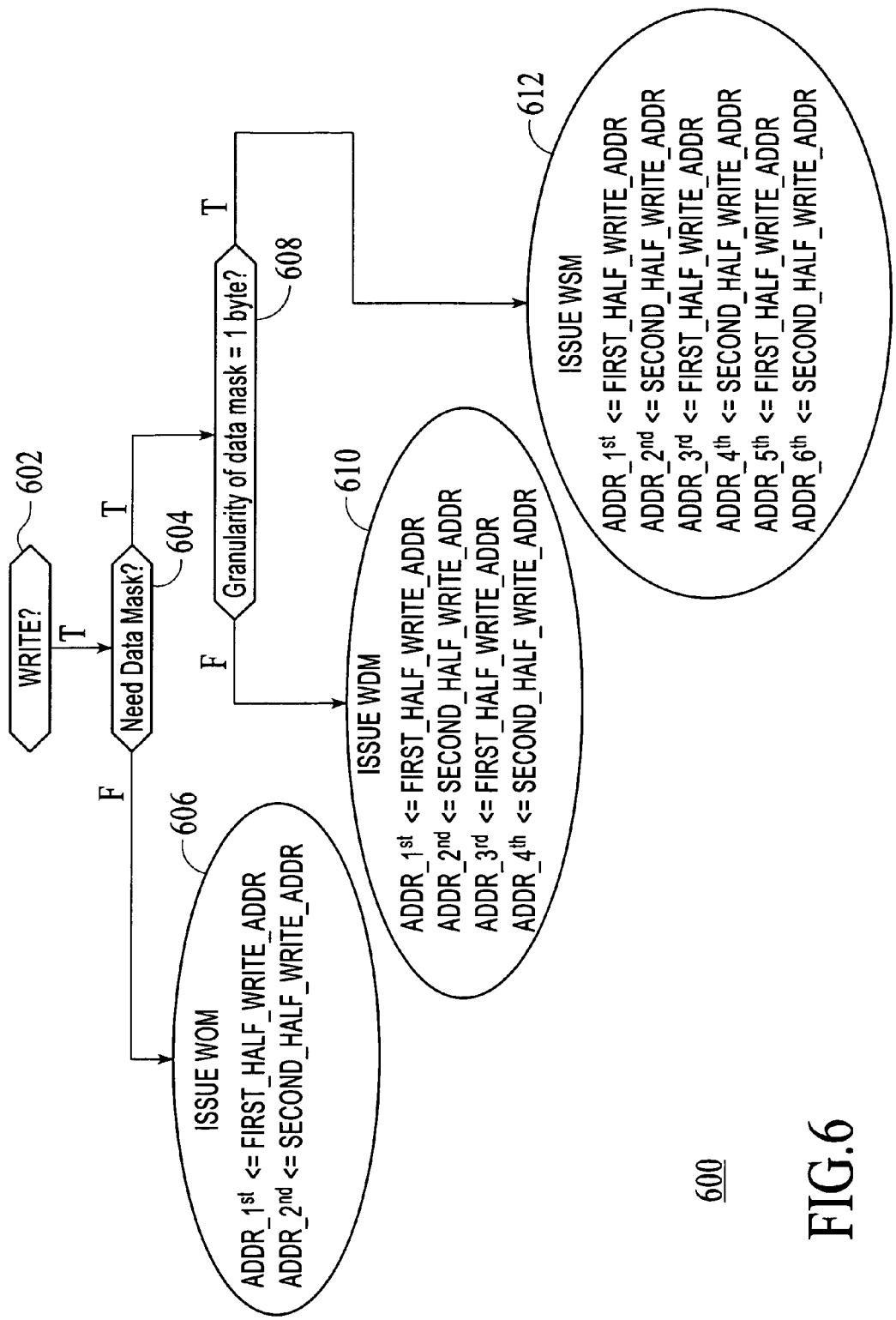
FIG. 6 is a flow diagram of a method performed by a memory controller, according to an embodiment.

FIG. 6 is a flow diagram of a method 600 performed by a memory controller such as the memory controller 202 according to an embodiment. At 602, the memory controller determines whether a request received from a memory client is a write request. If the received request is a write request, the memory controller then determines at 604 whether a data mask is needed. In an embodiment, the memory controller reads a data mask supplied by the client in the request, but embodiments are not so limited. If a data mask is not needed, the memory controller issues a WOM command and transmits the appropriate address bits at 606.

If a data mask is needed, the memory controller determines whether the granularity of the data mask is one byte at 608. If the granularity of the data mask is not one byte, the memory controller issues a WDM command and transmits the appropriate address bits at 610. If the granularity of the data mask is one byte, the memory controller issues a WSM command and transmits the appropriate address bits at 612.

In other embodiments, the granularity of the data mask could be more than two. In other embodiments, the desired data mask granularity and/or the desired write command could be specified by the client in the request.

Figure 7:
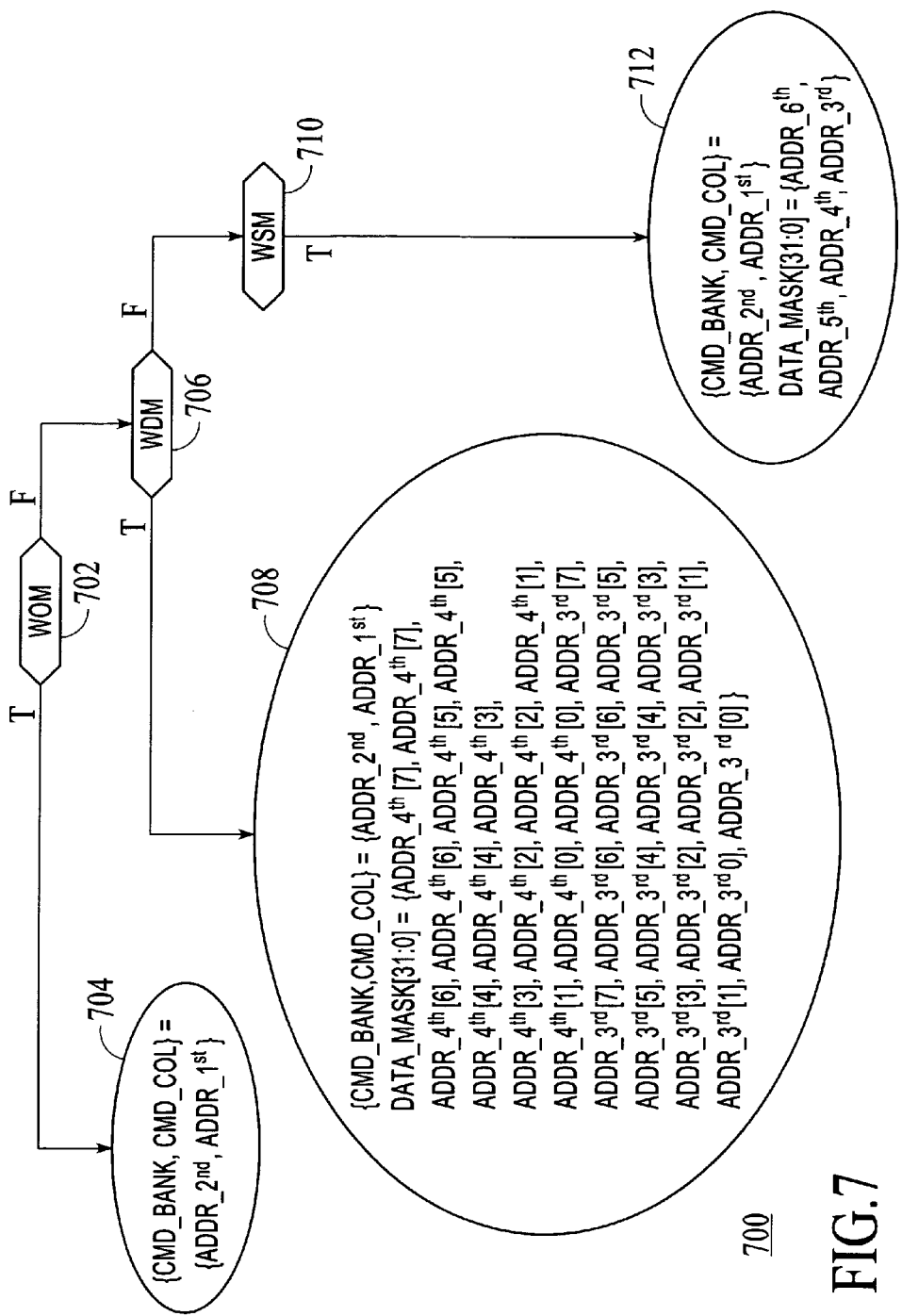
FIG. 7 is a flow diagram of a method performed by a memory device, according to an embodiment.

FIG. 7 is a flow diagram of a method 700 performed by a memory device such as the memory device 208 according to an embodiment. At 702 the memory device determines whether it has received a WOM command. If the memory device received the WOM command, the memory device performs a write at 704 of all of the received data to a location indicates by received address bits.

If the memory device did not receive a WOM command, the memory device determines whether it has received a WDM command at 706. If the memory device received a WDM command, the memory device performs a write of particular pairs of bytes of write data as indicates by the write data mask at 708.

If the memory device did not receive a WDM command, the memory device determines at 710 that is has received a WSM command. The memory device then performs a write of particular bytes of write data as indicates by the write data mask at 712.

Figure 8:
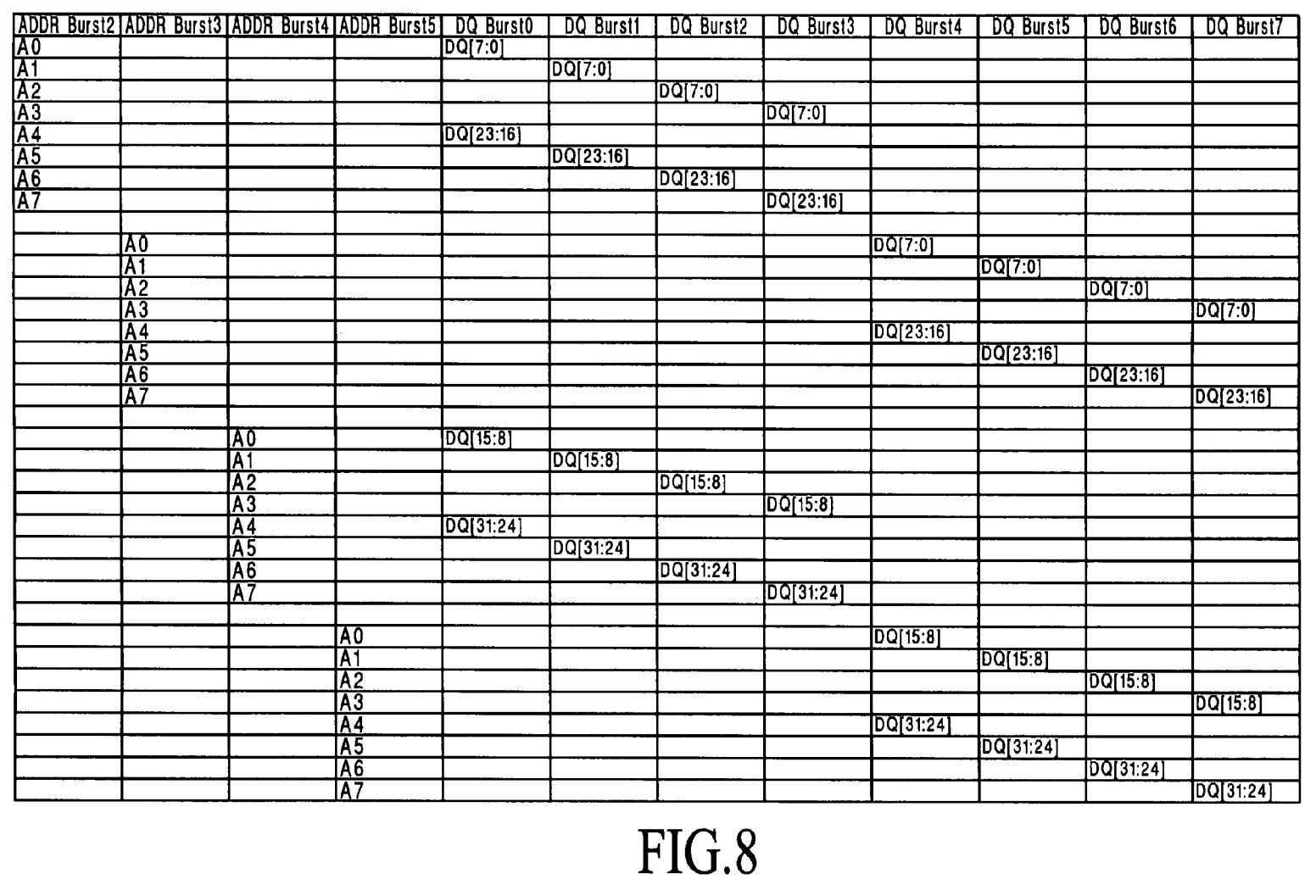

FIG. 8 is a diagram showing an alternative mapping of write data mask bits to data bytes for a WSM command according to an embodiment. FIG. 8 is an example mapping between a specific address bit (in a specific burst location) to a specific data bit (in a specific burst location) which it will serve as a mask bit for the address bit.

Aspects of the embodiments described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices, and standard cell-based devices, as well as application specific integrated circuits (ASICs) and fully custom integrated circuits. Some other possibilities for implementing aspects of the embodiments include microcontrollers with memory (such as electronically erasable programmable read only memory (EEPROM)), embedded microprocessors, firmware, software, etc. Furthermore, aspects of the embodiments may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies such as complementary metal-oxide semiconductor (CMOS), bipolar technologies such as emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number, respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word, any of the items in the list, all of the items in the list, and any combination of the items in the list.

The above description of illustrated embodiments of the system and method is not intended to be exhaustive or to limit the invention to the precise forms disclosed. While specific embodiments of, and examples for, the system and method are described herein for illustrative purposes, various equivalent modifications are possible within the scope of the invention, as those skilled in the relevant art will recognize. The teachings of the disclosure provided herein can be applied to other systems, not only for systems including graphics processing or video processing, as described above. The various operations described may be performed in a very wide variety of architectures and distributed differently than described. In addition, though many configurations are described herein, none are intended to be limiting or exclusive.

In other embodiments, some or all of the hardware and software capability described herein may exist in a printer, a camera, television, a digital versatile disc (DVD) player, a handheld device, a mobile telephone or some other device. The elements and acts of the various embodiments described above can be combined to provide further embodiments. These and other changes can be made to the system and method in light of the above detailed description.

In general, in the following claims, the terms used should not be construed to limit the system and method to the specific embodiments disclosed in the specification and the claims, but should be construed to include any processing systems and methods that operate under the claims. Accordingly, the system and method is not limited by the disclosure, but instead the scope of the method and system is to be determined entirely by the claims.

While certain aspects of the method and system are presented below in certain claim forms, the inventors contemplate the various aspects of the method and system in any number of claim forms. For example, while only one aspect of the system and method may be recited as embodied in computer-readable medium, other aspects may likewise be embodied in computer-readable medium. Accordingly, the inventors reserve the right to add additional claims after filing the application to pursue such additional claim forms for other aspects of the system and method.

What is claimed is:

1. An apparatus comprising:
   a receiver configured to receive a write request indicating particular bytes of data to be written in response to a write command, wherein the write request includes an indication of whether a data mask comprising a plurality of mask bits is present;
   circuitry configured to generate the write command, and on a condition that the data mask is present, the write command includes an indication of the data mask and that one of the plurality of data mask bits applies to a plurality of the particular bytes of data; and
   a transmitter configured to transmit to a second apparatus the write command on command lines and the data mask on address lines, wherein the write command including an indication of the data mask is performed in the same number of cycles as a write command without a data mask.

2. The apparatus of claim 1, wherein the write request includes the data mask.

3. The apparatus of claim 1, wherein the write request includes the particular bytes of data to be written and the bytes of data are transmitted on data lines.

4. The apparatus of claim 1, wherein on a condition the write request does not include the data mask, generating the write command indicating that each of the particular bytes of data is to be written.

5. The apparatus of claim 1, wherein the apparatus configures a data mask type based on the write request.

6. A system comprising:
   a client component configured to transmit a write request indicating particular bytes of data to be written in response to a write command, wherein the write request includes an indication of whether a data mask comprising a plurality of mask bits is present;
   a first system component configured to receive the write request from the client component and configured to generate the write command and on a condition that the data mask is present, the write command includes an indication of the data mask and that one of the plurality of mask bits applies to a plurality of the particular bytes of data; and
   a second system component configured to receive the write command from the first system component on command lines and the data mask on address lines, wherein the write command including an indication of the data mask is performed in the same number of cycles as a write command without a data mask.

7. The system of claim 6, wherein the write request includes the data mask.

8. The system of claim 6, wherein the write request includes the particular bytes of data to be written, wherein the bytes of data are transmitted on data lines.

9. The system of claim 6, wherein on a condition the write request does not include the data mask, generating the write command indicating that each of the particular bytes of data is to be written.

10. The system of claim 6, wherein a mask data logic element determines a data mask type based on the write request.

11. A method, comprising:
   receiving a write request indicating particular bytes of data to be written in response to a write command, wherein the write request includes an indication of whether a data mask comprising a plurality of mask bits is present;
   generating the write command and on a condition that the data mask is present, the write command includes an indication of the data mask and that one of the plurality of mask bits applies to a plurality of the particular bytes of data; and
   transmitting the write command to an apparatus on command lines and the data mask on address lines, wherein the write command including an indication of the data mask is performed in the same number of cycles as a write command without a data mask.

12. The method of claim 11, wherein the write request includes the data mask.

13. The method of claim 11, wherein the write request includes the particular bytes of data to be written, wherein the bytes of data are transmitted on data lines.

14. The method of claim 11, wherein on a condition the write request does not include the data mask, generating the write command indicating that each of the particular bytes of data is to be written.

15. The method of claim 11, wherein a data mask type is based on the write request.

16. A method comprising:

transmitting a write request, to a first system component, indicating particular bytes of data to be written in response to a write command, wherein the write request includes an indication of whether a data mask comprising a plurality of mask bits is present;

generating the write command, by the first system component and on a condition that the data mask is present, the write command includes an indication of the data mask and that one of the plurality of mask bits of the data mask applies to a plurality of the particular bytes of data;

receiving the write command, by a second system component generated by the first system component, on command lines and the data mask on address lines, wherein the write command including an indication of the data mask is performed in the same number of cycles as a write command without a data mask.

17. The method of claim 16, wherein the write request includes the data mask.

18. The method of claim 16, wherein the write request includes the particular bytes of data to be written, wherein the bytes of data are transmitted on data lines.

19. The method of claim 16, wherein on a condition the write request does not include the data mask, generating the write command indicating that each of the particular bytes of data is to be written.

20. The method of claim 16, wherein a data mask type is based on the write request.

* * * * *